United States Patent [19]

Hay et al.

[11] Patent Number: 5,697,322
[45] Date of Patent: Dec. 16, 1997

[54] ANALOG DISPLAY HAVING ELECTROLUMINESCENT POINTER

[75] Inventors: William E. Hay, Gilbert; Douglas B. Olson, Phoenix, both of Ariz.; Stephen F. Hamann, Corvallis, Oreg.; William C. Sherbrooke, Commerce Township, Mich.

[73] Assignee: Durel Corporation, Phoenix, Ariz.

[21] Appl. No.: 593,578

[22] Filed: Jan. 30, 1996

[51] Int. Cl.⁶ .............. G01D 13/28; G01R 1/08; G04B 19/32
[52] U.S. Cl. ............ 116/286; 116/DIG. 6; 116/DIG. 35; 116/DIG. 36; 368/226; 368/238
[58] Field of Search ............... 116/286, 287, 116/288, 310, DIG. 6, DIG. 35, DIG. 36; 362/23, 26, 84; 368/226, 227, 228, 234, 238

[56] References Cited

U.S. PATENT DOCUMENTS

| 2,792,803 | 5/1957 | Hardesty | 116/286 |
|---|---|---|---|
| 3,071,105 | 1/1963 | Wertheimer | 116/286 |
| 3,094,970 | 6/1963 | Zargarpur | 116/286 |
| 3,219,008 | 11/1965 | Harris et al. | 116/286 |
| 4,163,428 | 8/1979 | Isikawa | 116/288 |
| 4,995,022 | 2/1991 | Ikeda et al. | 368/226 |
| 5,523,922 | 6/1996 | Kato | 362/23 |
| 5,623,456 | 4/1997 | Miyamoto et al. | 368/226 |

FOREIGN PATENT DOCUMENTS

| 837070 | 6/1952 | Germany | 368/228 |
|---|---|---|---|
| 1286214 | 1/1969 | Germany | 116/DIG. 35 |
| 77016 | 4/1991 | Japan | 362/23 |
| 2204993 | 11/1988 | United Kingdom | 362/84 |

*Primary Examiner*—William A. Cuchlinski, Jr.
*Assistant Examiner*—Willie Morris Worth
*Attorney, Agent, or Firm*—Paul F. Wille

[57] ABSTRACT

An analog display includes a dial and a movable EL pointer positioned adjacent the dial for indicating a measured value. The pointer is an elongated EL lamp having a conductive pin extending through one end of the lamp and about which the lamp pivots. The pin is mechanically secured to the lamp and is electrically connected to the front electrode of the lamp. A hole larger than cross-sectional diameter of the pin is formed in the rear electrode and in the phosphor layer to prevent the pin from shorting the front electrode to the rear electrode. A conductive spring rests on the pin to provide electrical power to the front electrode. Power is supplied to the rear electrode either through a conductive ferrule attached to the rear electrode or through a resilient wiper. The wiper can be attached to the pointer or to the face of the dial. For plural pointers, concentric conductive pins are used with a sliding contact for the rear electrodes.

16 Claims, 3 Drawing Sheets

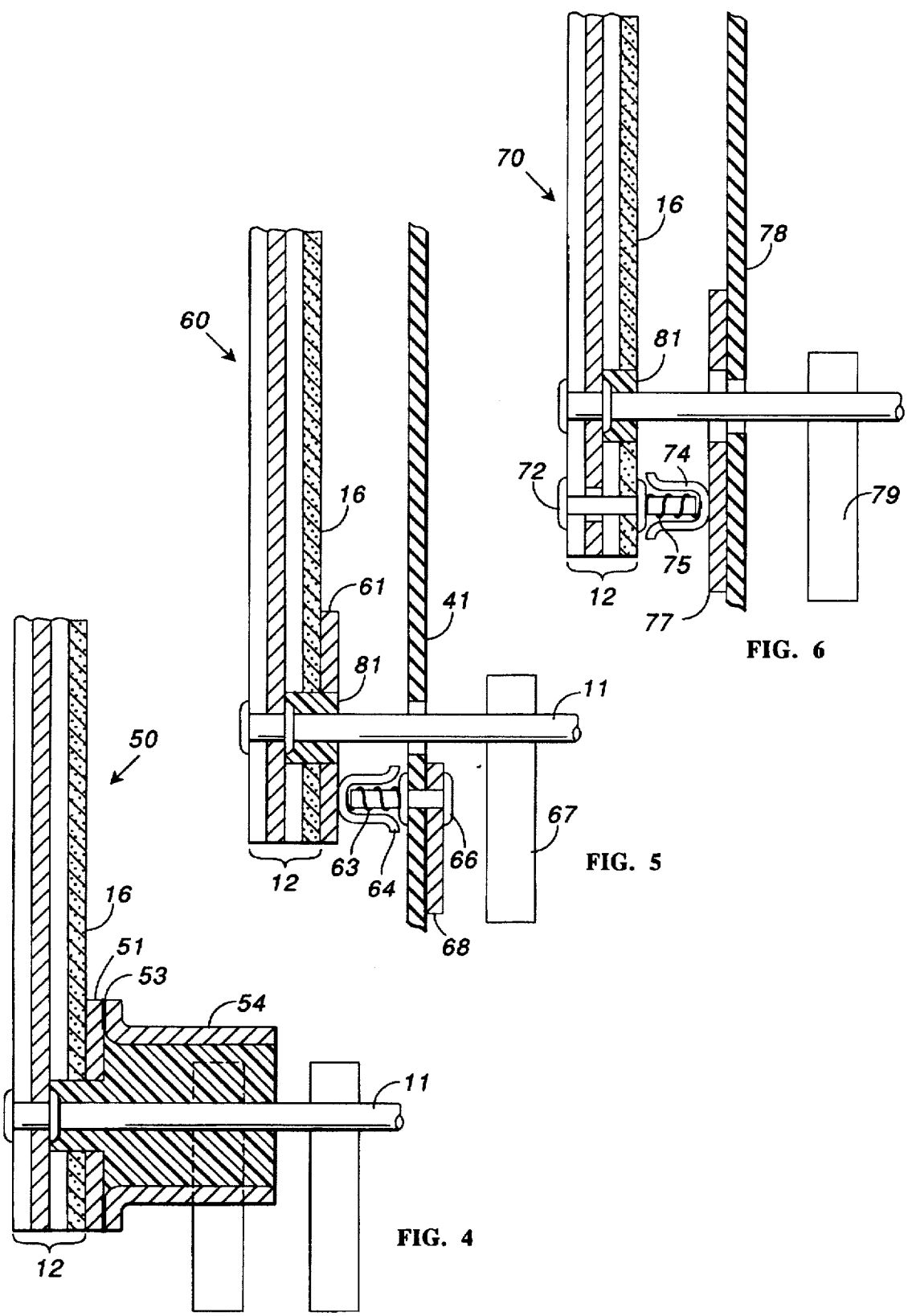

ANALOG DISPLAY HAVING ELECTROLUMINESCENT POINTER

BACKGROUND OF THE INVENTION

This invention relates to an analog display having a pointer including an electroluminescent (EL) lamp and, in particular, to sliding contacts for supplying electrical power to the lamp.

Analog displays having electroluminescent pointers are known in the prior art. For example, U.S. Pat. No. 2,792,803 (Hardesty) discloses an EL pointer in which the rear electrode is connected to the shaft on which the pointer rotates and the front electrode is connected by a flexible pigtail to a conductive coating on the inside surface of the dial face of the analog display. U.S. Pat. No. 3,094,970 (Zargarpur) discloses an analog display having a moving pointer coated with EL phosphor. The electrical connection to the pointer is somewhat tortuous, including a watch spring for biasing the pointer to a rest position. U.S. Pat. No. 3,219,008 (Harris et al.) discloses an analog display having a moving pointer including an EL lamp. The lamp is deposited on a conductive pointer, which acts as one electrode of the lamp. The pointer is connected to a conductive, hollow shaft and a conductive spring rests on the outside of the shaft to provide a sliding contact. Electrical contact to the front electrode is by way of a wire passing through the hollow shaft.

EL lamps of the same vintage as the above-identified patents were typically formed on metal or glass substrates, as most thin-film EL lamps are made today, although the vintage lamps were not thin-film devices. A lamp/pointer was a coated metal rod, i.e. a custom lamp. It is desired to adapt a modern, thick film EL lamp as a pointer.

A thick-film EL lamp is essentially a capacitor having a dielectric layer between two conductive electrodes, one of which is transparent. The dielectric layer includes a phosphor powder that radiates light in the presence of a strong electric field, using very little current. The front electrode is typically a thin, transparent layer of indium tin oxide or indium oxide and the rear electrode is typically a polymer binder, e.g. polyvinylidene fluoride (PVDF), polyester, vinyl, or epoxy, containing conductive particles such as silver or carbon. The front electrode is applied to a substrate of polymer film, such as polyester or polycarbonate, which provides mechanical integrity and support for the other layers.

Electrical connections to a pivoting EL lamp are difficult to make reliably. The laminar construction of an EL lamp provides easy access to the rear electrode of the lamp and limited access to the front electrode of the lamp, which is on the inner surface of the substrate. Connecting a wire to the front electrode is made more difficult because the front electrode is thin. Wires connected to an EL pointer must be compliant to avoid affecting the positioning of the pointer, yet must be substantial enough to withstand repeated flexing as the pointer is moved.

Ignoring cost, one could probably build up a sufficiently rugged structure for supporting an elongated EL lamp pivoting about one end and make electrical connections to the lamp. The problem is that one cannot ignore cost, which can arise from several sources. The design of the pointer can affect cost, depending upon the number of components and the difficulty of assembling the components. The materials used in making a pointer can affect cost, as can the process required; i.e. a custom process is more expensive than a standard process.

Connections to a single, luminous pointer are difficult and providing connections to a pair of pointers, e.g. the hands of a clock or watch, is a problem that has not been solved in the prior art. In a clock or a watch, the dial face is luminous and the hands are silhouetted against the luminous face. It has long been desired to provide luminous hands for clocks or watches.

In view of the foregoing, it is therefore an object of the invention to provide an analog display having an EL lamp as the pointer wherein the front electrode of the lamp is electrically and mechanically connected to a pin on which the lamp pivots.

Another object of the invention is to provide an analog display having an EL pointer in which the electrical connections to the lamp are made without the use of flexible wire.

A further object of the invention is to provide a sliding contact for an EL lamp.

Another object of the invention is to provide an analog display having a pointer structure that can be made inexpensively and reliably and using, as much as possible, existing process steps and relatively few components.

A further object of the invention is to provide luminous hands for a clock or watch.

SUMMARY OF THE INVENTION

The foregoing objects are achieved in this invention in which an analog display includes a dial and a movable EL pointer positioned adjacent the dial for indicating a measured value. The pointer is an elongated EL lamp having a conductive pin extending through one end of the lamp and about which the lamp pivots. The pin is mechanically secured to the lamp and is electrically connected to the front electrode of the lamp. A hole larger than cross-sectional diameter of the pin is formed in the rear electrode and in the phosphor layer to prevent the pin from shorting the front electrode to the rear electrode. A conductive spring rests on the pin to provide electrical power to the front electrode. Power is supplied to the rear electrode either through a conductive ferrule attached to the rear electrode or through a resilient wiper. The wiper can be attached to the pointer or to the face of the dial. For plural pointers, concentric conductive pins are used with a sliding contact for the rear electrodes.

BRIEF DESCRIPTION OF THE DRAWINGS

A more complete understanding of the invention can be obtained by considering the following detailed description in conjunction with the accompanying drawings, in which:

FIG. 4 is a cross-section of a pointer constructed in accordance with an alternative embodiment of the invention;

FIG. 5 is a cross-section of a pointer constructed in accordance with another aspect of the invention;

FIG. 6 as an alternative embodiment of the pointer illustrated in FIG. 5; and

DETAILED DESCRIPTION OF THE INVENTION

Figure 1:
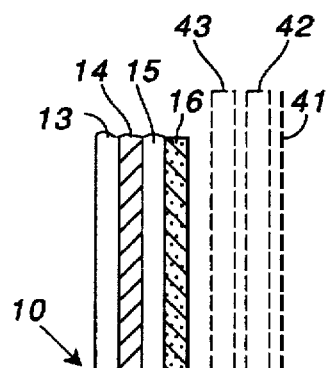
FIG. 1 is a cross-section of a portion of an analog display having a pointer including an EL lamp and connections for the lamp constructed in accordance with the invention.

FIG. 1 illustrates a portion of an analog display constructed in accordance with the invention in which pointer 10 is an EL lamp mechanically and electrically connected to pin 11, about which the lamp rotates. EL lamp 12 is of standard construction and includes transparent substrate 13, front electrode 14, electroluminescent layer 15, and rear electrode 16. The relative thicknesses of elements 14, 15, and 16 are not shown to scale or in proportion. EL layer 15 can be a single layer including dielectric material and phosphor or can be two separate layers with the phosphor layer adjacent to transparent substrate 13.

EL lamp 12 is made as a large panel and then cut into strips to make a plurality of elongated lamps. A portion of electroluminescent layer 15 and rear electrode 16 is removed to provide access to front electrode 14. A hole is punched in substrate 13 to provide clearance for pin 11. Pin 11 preferably includes shoulder 18 that contacts front electrode 14. Cap 19 is preferably made by swaging or deforming a portion of pin 11 to expand outwardly over a portion of substrate 13, firmly gripping the substrate between cap 19 and shoulder 18. Thus, pin 11 is electrically and mechanically secured to lamp 12. Pin 11 provides both electrical contact to front electrode 14 and a means for pivoting pointer 10.

Connection to rear electrode 16 is provided by ferrule 21, which is mechanically and electrically secured to rear electrode 16 by conductive adhesive 23. Ferrule 21 has a cylindrical shape, having an axis parallel with pin 11, and preferably includes a flared end to provide an enlarged area for contact with rear electrode 16. The interior of ferrule 21 is filled with insulator 25, preferably epoxy resin. Insulator 25 performs several functions; specifically, the insulator increases the mechanical connection between pin 11 and lamp 12 and provides a chemical barrier between rear electrode 16 and the front electrode. Rear electrode 16 is screen printed from a conductive ink containing silver particles. Insulator 25 prevents silver migration across the small gap between the front and rear electrodes of lamp 12.

Pin 11 and ferrule 21 are made from metal, e.g. nickel plated copper, and electrical contact is made by way of conductive springs 31 and 32, which are preferably nickel plated beryllium copper. Conductive spring 31 is mechanically biased against pin 11 to provide electrical contact to front electrode 14. Conductive spring 32 is mechanically biased against ferrule 21 to provide electrical contact to rear electrode 16. Supplying a high voltage alternating current to springs 31 and 32 causes lamp 12 to light.

The analog display includes second EL lamp 42 overlying face 41. Mask 43 overlies EL lamp 42 and includes a plurality of opaque and translucent areas to define a graphic that is backlit by the lamp. Face 41, lamp 42, and mask 43 together are the dial of the analog display and pin 11 and ferrule 21 pass through a hole in the dial.

Figure 2:
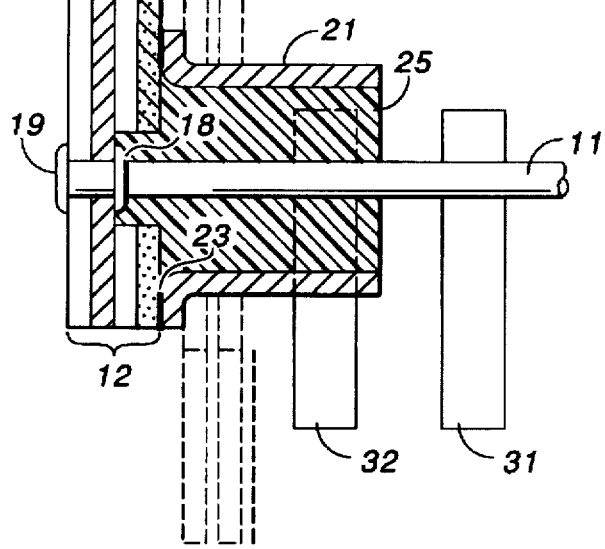
FIG. 2 is a plan view of the rear electrode of the pointer shown in FIG. 1.

FIG. 2 is a plan view of pointer 10 as seen from the back of the analog display, wherein rear electrode 16 is represented by the stippled area. Pointer 10 includes an enlarged end portion 45 approximately centered around pin 11. The portion of rear electrode 16 covering enlarged end portion 45 is a conductive annulus around pin 11 and provides a large contact area for a ferrule (not shown in FIG. 2).

Figure 3:
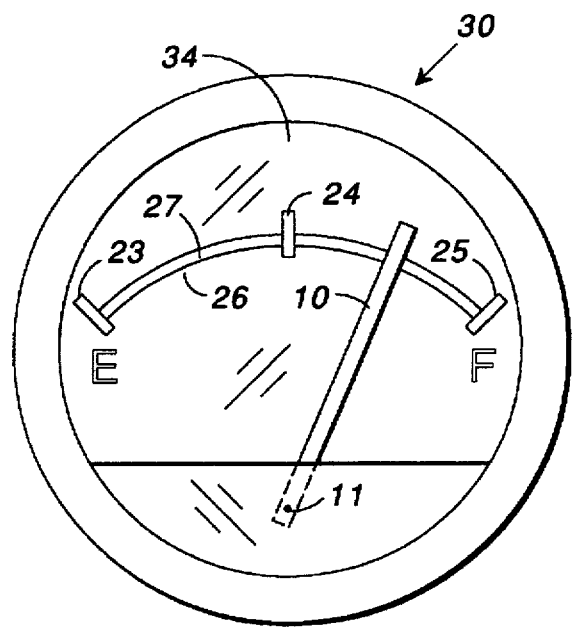
FIG. 3 is a front view of an analog display constructed in accordance with the invention.

FIG. 3 is a plan view of an analog display including an EL pointer for indicating a measured value, such as the fullness of a storage tank. Analog display 30 includes pointer 10 mounted on pin 11. Pointer 10 overlies opaque mask 34 and is rotated by a suitable mechanism such as a stepper motor or galvanometer (not shown). Opaque mask 34 includes translucent indicia 23, 24, and 25, translucent arc 26, and translucent letters "E" and "F", permitting the light from underlying EL lamp 27 to pass through the mask. The opaque areas of mask 34 are preferably dark colored or black. Because the phosphor layer in an EL lamp is also reflective, the mask and EL lamps combine to produce a light on dark display with or without ambient light.

FIG. 4 illustrates a pointer constructed in accordance with an alternative embodiment of the invention. Pointer 50 includes metal layer 51 attached to rear electrode 16 by a conductive adhesive. Metal layer 51 is preferably tinned copper foil having a thickness of approximately 2.5 mils and a conductive, adhesive backing. Such foil is commercially available in rolls. The foil is cut into rings and applied to the rear electrode, encircling the aperture previously formed to provide clearance for pin 11. Ferrule 54 is attached to foil 51 by conductive adhesive or by solder, as indicated at 53. Foil 51 provides a larger contact area between ferrule 54 and rear electrode 16, thereby reducing the resistance of the contact. Pointer 50 operates in the same manner as pointer 10.

FIG. 5 illustrates a pointer constructed in accordance with an alternative embodiment of the invention wherein one spring contact is biased in a direction perpendicular to the length of pin 11 and the second contact is biased in a direction parallel with the length of pin 11. Pointer 60 includes lamp 12 constructed as described above. Annular metal layer 61 is attached to rear electrode 16 to provide a more durable contact surface than provided by the rear electrode alone. Metal layer 61 is preferably a copper foil or a silver foil attached to rear electrode 16 by a conductive adhesive, as described above in conjunction with metal layer 51 (FIG. 4).

Electrical connection to rear electrode 16 is provided by spring loaded wiper 63 that rides on metal layer 61 and is urged into contact with the metal layer by spring 64. Spring 64 is preferably a helical spring concentric with conductive pin 66. Face 41 is typically plastic and so a metal layer is applied to either side of face 41 to provide electrical connection to pin 66. As shown in FIG. 5, metal layer 68 is applied to the side of face 41 away from pointer 60. Conductors attached to spring 67 and to metal layer 68 provide electrical connection to a AC source (not shown).

FIG. 6 illustrates and alternative embodiment of the invention wherein the wiper is attached to the pointer and contacts a metal layer on the face of the dial. Pointer 70 includes EL lamp 12 and pin 72, the pin being resiliently coupled to wiper 74 by conductive spring 75. Wiper 74 is in mechanical and electrical contact with metal layer 77 on dial 78. Electrical connection to lamp 12 is provided by conductors attached to metal layer 77 and to spring 79. In FIGS. 5 and 6, the substrate of lamp 12 can be made slightly thicker than normal to withstand the force applied by the spring in the wiper mechanism. Also in FIGS. 5 and 6, insulator 81 is preferred but optional.

Figure 7:
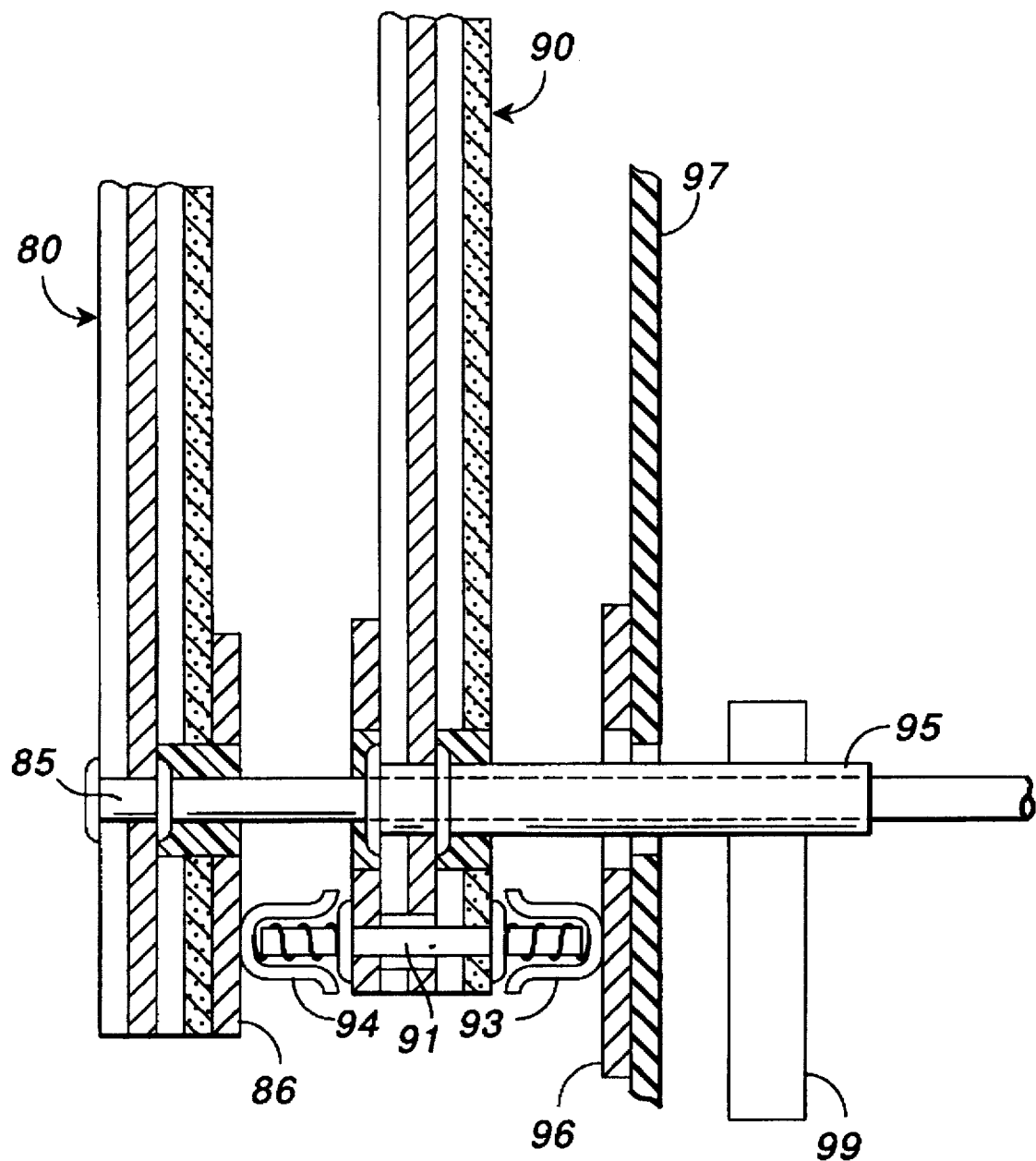
FIG. 7 is a cross-section of a clock constructed in accordance with the invention.

FIG. 7 illustrates an alternative embodiment of the invention in which a pair of electroluminescent pointers are mounted on concentric pins. Pointer 80 is mechanically and electrically connected to pin 85 and pointer 90 is mechanically and electrically connected to pin 95. Pin 85 is concentric with pin 95 and is in electrical contact with pin 95 along their common length.

Pointer 80 is constructed in the same manner as pointer 60 (FIG. 5) and pointer 90 is constructed in a manner similar to pointer 70 (FIG. 6) except that pin 91 extends through pointer 90 and is connected to a wiper at each end. Wiper 93 resiliently contacts metal layer 96 on face 97 and wiper 94 resiliently contacts metal layer 86. Metal layer 96 provides electrical contact to the rear electrode of each pointer and spring 99 provides electrical contact to the front electrode of each pointer. Wipers 93 and 94 are more suited to a clock than to a watch. A Simpler wiper, e.g. a coiled spring or a leaf spring, is more easily miniaturized for use in a watch.

It is preferred, particularly for watch hands, to perform as many operations as possible on a lamp panel before cutting the panel into strips. For example, a watch hand may have a width of only twelve mils and the punching and etching operations are much more easily performed on a panel than on such a small strip.

The invention thus provides an analog display having an electroluminescent pointer that can be made inexpensively and reliably using, as much as possible, existing process steps. The front electrode of the lamp is electrically and mechanically connected to a pin on which the lamp pivots and the electrical connections to the lamp are made by sliding contacts, without the use of flexible wire.

Having thus described the invention, it will be apparent to those of skill in the art that various modifications can be made within the scope of the invention. For example, connection to the springs can be made by any suitable wire or flexible circuit connector. While illustrated in a preferred embodiment as a pointer having a single EL lamp, the invention can be applied to pointers having more than one lamp. The entire transparent substrate need not be thicker than for other applications; a reinforcement can be applied to the front of the lamp in the region of the pin. The wiper can be positioned above or below the pivot pin. The invention enables one to minimize costs by using standard lamps and materials but this does not mean that materials other than those described cannot be used.

What is claimed is:

1. An analog display having a dial and a movable pointer positioned adjacent said dial for indicating a measured value, wherein said pointer comprises:
   (a) an elongated EL lamp having a first end and a second end, said lamp including as consecutive layers
     (i) a transparent substrate;
     (ii) a transparent, front electrode;
     (iii) an electroluminescent layer; and
     (iv) a rear electrode;
   (b) a first conductive pin extending through said lamp near said first end and through said dial;
   (c) means for making contact with said rear electrode;
   (d) wherein said first conductive pin is electrically connected to said front electrode;
   (e) wherein said electroluminescent layer and said rear electrode including a hole larger than said first conductive pin to prevent said first conductive pin from shorting said front electrode to said rear electrode; and
   (f) wherein said lamp pivots with said first conductive pin for indicating said measured value.

2. The analog display as set forth in claim 1 and further comprising a second movable pointer including a second elongated EL lamp and a second conductive pin extending through a first end of said second elongated EL lamp, wherein said second conductive pin is concentric with said first conductive pin.

3. The analog display as set forth in claim 2 wherein said second conductive pin is electrically connected to the front electrode of said second elongated EL lamp.

4. The analog display as set forth in claim 1 and further comprising a conductive spring in sliding contact with said first conductive pin for coupling electrical power to said front electrode.

5. The analog display as set forth in claim 1 wherein said means Comprises:
   a cylindrical, conductive ferrule having an axis approximately parallel with said first conductive pin, said ferrule in contact with said rear electrode and enclosing said hole.

6. The analog display as set forth in claim 5 and further comprising insulating material in said hole and in said ferrule for electrically isolating said ferrule from said first conductive pin and for supporting said first conductive pin within said ferrule.

7. The analog display as set forth in claim 6 wherein said insulating material is epoxy resin.

8. The analog display as set forth in claim 5 wherein said ferrule is flared at one end thereof and said one end is in electrical contact with said rear electrode.

9. The analog display as set forth in claim 5 and further comprising a conductive metal layer on said rear electrode between said rear electrode and said ferrule, said metal layer increasing the contact area between said rear electrode and said ferrule.

10. The analog display as set forth in claim 9 wherein said conductive metal layer is in the shape of an annulus surrounding said hole.

11. The analog display as set forth in claim 5 and further comprising a conductive spring in sliding contact with said ferrule for coupling electrical power to said rear electrode.

12. The analog display as set forth in claim 4 wherein said means comprises:
   a conductive metal layer on said rear electrode;
   a conductive wiper attached to said dial and in electrical contact with said metal layer for coupling electrical power to said rear electrode.

13. The analog display as set forth in claim 12 wherein said conductive metal layer is in the shape of an annulus surrounding said hole.

14. The analog display as set forth in claim 4 and further comprising:
   a conductive metal layer on said dial adjacent said pointer;
   a conductive wiper attached to said pointer and in electrical contact with said metal layer for coupling electrical power to said rear electrode.

15. The analog display as set forth in claim 14 wherein said conductive metal layer at least partially surrounds said first conductive pin.

16. The analog display as set forth in claim 14 wherein said wiper is attached to said pointer between said first conductive pin and said first end.

* * * * *